United States Patent [19]

Dutta

[11] Patent Number: 4,947,400
[45] Date of Patent: Aug. 7, 1990

[54] LASER-PHOTODETECTOR ASSEMBLAGE

[75] Inventor: Niloy K. Dutta, Colonia, N.J.

[73] Assignee: AT&T Bell Laboratories, Murray Hill, N.J.

[21] Appl. No.: 371,474

[22] Filed: Jun. 26, 1989

[51] Int. Cl.[5] .......................... H01S 3/19; H01L 31/12
[52] U.S. Cl. .......................................... 312/50; 357/19
[58] Field of Search ............................. 372/50; 357/19

[56] References Cited

U.S. PATENT DOCUMENTS

| 4,470,143 | 9/1984 | Kitamura et al. | 372/50 |
| 4,771,434 | 9/1988 | Yoshida et al. | 372/50 |
| 4,774,711 | 9/1988 | Hara | 372/50 |

Primary Examiner—William L. Sikes
Assistant Examiner—Georgia Y. Epps
Attorney, Agent, or Firm—Eli Weiss

[57] ABSTRACT

Briefly, in the invention a photodetector and an injection laser are monolithically integrated on the same semiconductor chip. The laser and photodetector are positioned side-by-side and the laser mirrors can be formed by cleaving. In operation, a portion of the electromagnetic energy carried in the evanescent tail of the optical mode is detected by the photodetector for monitoring the average output power of the laser. Current confinement and lateral index guiding can be provided by Fe or Ti doped semi-insulating layers of InP. The side-by-side arrangement enables the photodetector to monitor the output power of the laser without degrading the output power.

3 Claims, 2 Drawing Sheets

LASER | PHOTODETECTOR

LIGHT vs CURRENT CHARACTERISTICS OF A
DCPBH LASER WITH SEMI-INSULATING CURRENT CONFINING
LAYERS

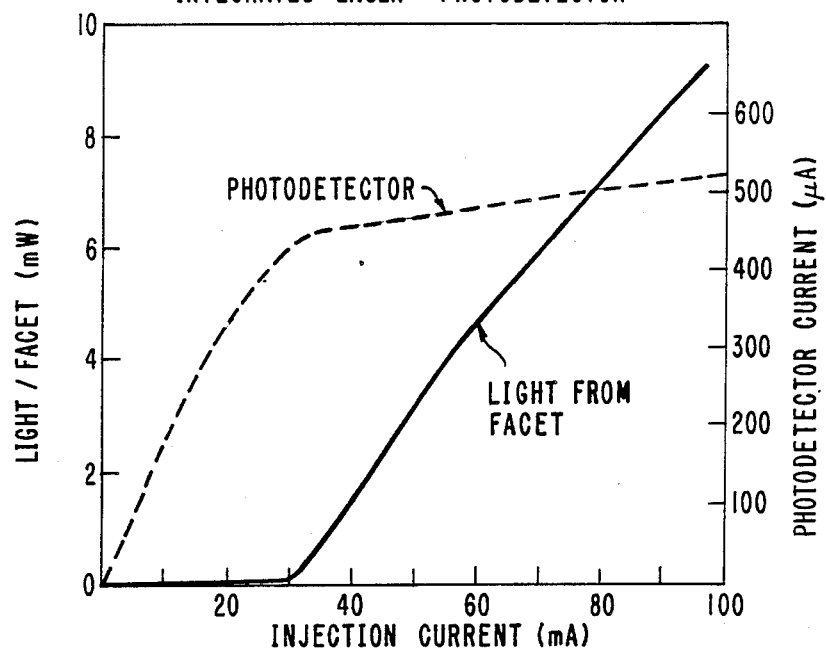
FIG. 3 PERFORMANCE CHARACTERISTICS OF THE INTEGRATED LASER - PHOTODETECTOR
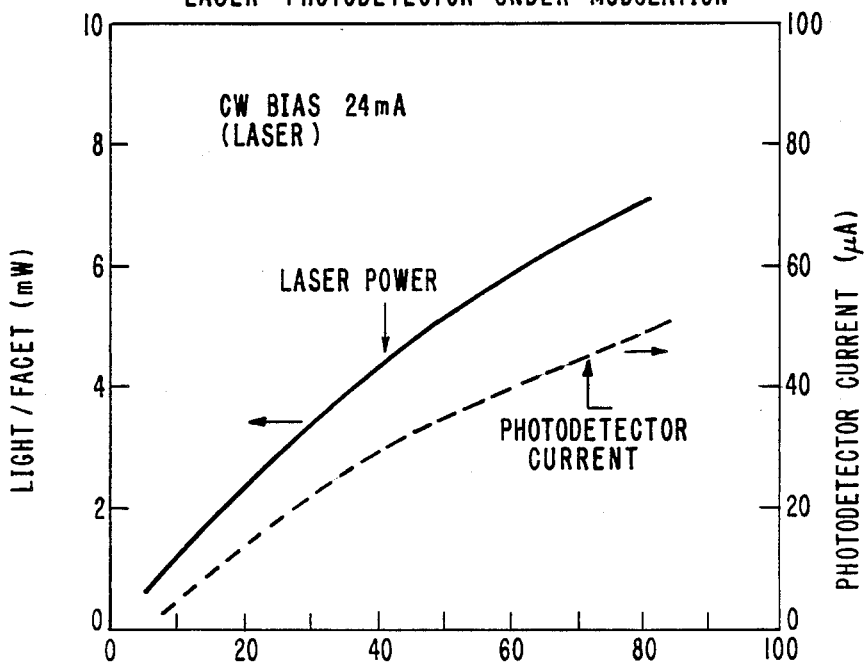
FIG. 4 CHARACTERISTICS OF THE INTEGRATED LASER - PHOTODETECTOR UNDER MODULATION

LASER-PHOTODETECTOR ASSEMBLAGE

TECHNICAL FIELD

This invention relates generally to lasers and more particularly to a semiconductor injection laser integrated on a wafer together with a monitoring detector.

BACKGROUND OF THE INVENTION

Semiconductor injection lasers are used as light sources in long-haul optical fiber transmission system where the information which is transmitted is in the form of an encoded light beam which propagates through a glass fiber. The encoded light beam is generated by modulating the current injected into the laser. For error-free transmission, the intensity of the transmitted light beam must be maintained within a specific allowable range. This is usually accomplished by measuring the power output of the laser with a monitoring photodetector which is physically separate from the laser. The monitoring detector measures the average power output of the laser. The signal from the monitoring detector, acting through a feedback circuit, adjusts the injection current of the laser to maintain the average power output of the laser within the allowable range. This adjustment is necessary because the output power may change slowly during operation as a result of slow degradation and/or as a result of variations of the ambient temperature.

Currently, the output power of a laser is measured by diverting a portion of the generated optical power to a separate optical detector. While a separate detector is adequate, it is desirable to have a photodetector which is integrated with the semiconductor injection laser in the same semiconductor chip. Integration of a laser with a photodetector on the same chip can result in a compact laser-photodetector device which has a reduced size, operates with increased speed, provides high performance and has good reliability—all at a lower cost.

SUMMARY OF THE INVENTION

Briefly, in the invention a photodetector and an injection laser are integrated on the same semiconductor chip. The laser and photodetector are positioned side-by-side and the laser mirrors can be formed by cleaving. In operation, a portion of the electromagnetic energy carried in the evanescent tail of the optical mode is detected by the photodetector for monitoring the average output power of the laser. Current confinement and lateral index guiding can be provided by Fe or Ti doped semi-insulating layers of InP. The side-by-side arrangement enables the photodetector to monitor the output power of the laser without degrading the performance of the laser.

BRIEF DESCRIPTION OF THE DRAWING

FIG. 3 illustrates the performance characteristics of the integrated laser-photodetector by showing the photodetector current as a function of the current in the laser section; and FIG. 4 illustrates the characteristics of the integrated laser-photodetector under modulation by showing the photodetector current as a function of pulsed injection current.

DETAILED DESCRIPTION

Semiconductor injection lasers are used as sources of optical energy in long-haul optical fiber transmission systems where the information that is being transmitted is represented by encoded light beams which propagate through glass fibers. The encoded light beams are generated by modulating the current which is injected into the laser. For error-free transmission, the intensity of the transmitted light should be maintained within a predetermined range. This is normally accomplished by diverting some of the light from the laser to a monitoring photodetector. The monitoring photodetector measures the average power output of the laser. The signal generated by the photodetector is used to control a feedback circuit which is coupled to adjust the injection current to the laser to keep the average power output of the laser within the predetermined range. This control of the output power of the laser is necessary because the output power can change slowly over a period of time as a result of aging or slow degradation of the laser or by variations of ambient temperature.

Although a separate monitoring photodetector is adequate for most applications, it is desirable to have a photodetector and a laser integrated in the same semiconductor chip. In this invention, a new improved laser-photodetector structure is disclosed where the laser and the photodetector are positioned side-by-side and the laser mirrors are formed by cleaving as opposed to etched facets. The side-by-side relationship of the laser-photodetector enables the photodetector to monitor the output power of the laser without requiring that a small portion of the output power be diverted to the photodetector. Cleaved facets are preferred because etched facets generally have lower reflectivities which result in higher threshold currents and lower external differential quantum efficiencies than for cleaved mirror lasers.

Figure 1:
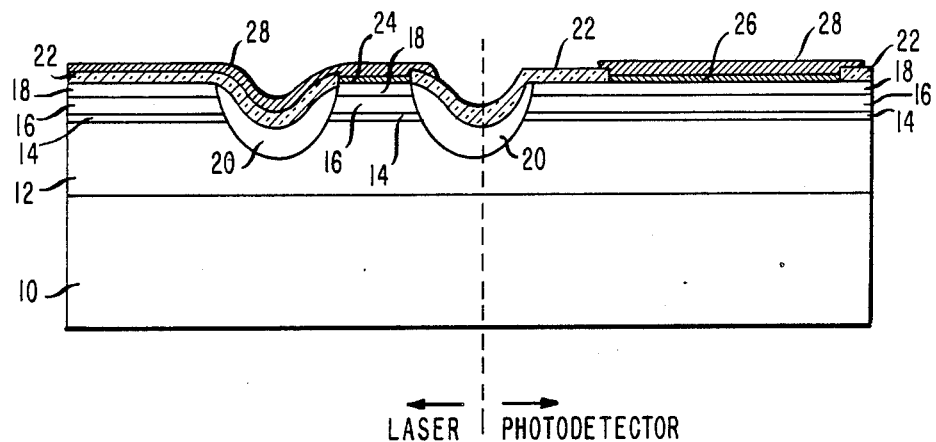
FIG. 1 is a sectional view of an integrated laser and photodetector structure in accordance with the principles of the invention.

Referring to FIG. 1, there is illustrated a schematic side view of structure in accordance with the principles of the invention. The structure is fabricated by depositing four layers by epitaxy growth techniques such as liquid phase epitaxy to an n-InP substrate 10 to form a wafer, for example, as follows: n-InP buffer layer 12, an undoped InGaAsP active layer 14; a p-In cladding layer 16; and a p-InGaAsP contact layer 18. Two channels are then etched on the wafer substantially parallel to the (110) direction using a wet or dry chemical etchant and a dielectric mask such as a SiO$_2$ mask which is deposited using photolithographic techniques. Fe-doped semi-insulating InP layers 20 or Ti-doped semi-insulating InP layers 20 can then be selectively grown only in the two channels by metal organic chemical vapor deposition (MOCVD) growth techniques. The presence of the mask prevents nucleation and hence the growth of InP in regions outside of the channel. The wafer is then processed to provide a laser in one channel and a photodetector in the other channel using standard metallization and photolithographic techniques. The final device is an integrated laser-photodetector chip.

The laser and the photodetector in the structure illustrated in FIG. 1 are positioned "side-by-side". The confinement of the current to the active region in the laser section is provided by dielectric 22 deposited on the contact layer 18 and by the semi-insulating layer 20 located in the channels. The undoped InGaAsP layer 14 which is bounded by the p-type and n-type InP cladding layers 16, 12 services as both the light emitting region (active region) for the laser and absorbing region for the photodetector. The laser contact 24 and photodetector 26 on the p-side are isolated by a layer 28 of $SiO_2$.

Figure 2:
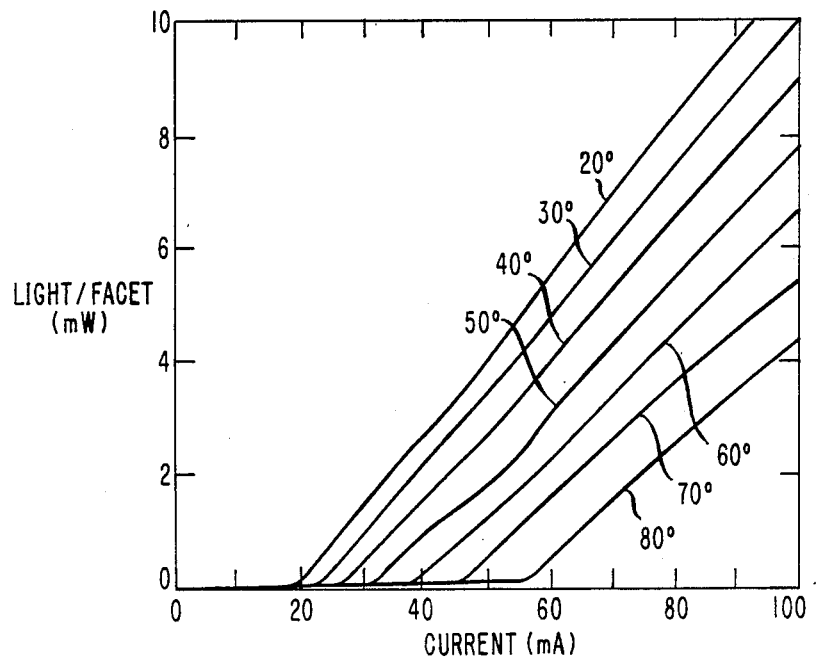
FIG. 2 illustrates the light vs. current characteristics of the laser with semi-insulating current confining layers.

The light vs. current characteristics of a double channel planar buried heterostructure laser with semi-insulating current confining layer at different temperatures are illustrated in FIG. 2. Typical threshold currents are in the range of 20-30 mA at 30° C. This is comparable to the values observed in other types of strongly index guided laser structures. The frequency response characteristics of the laser were found to be unaffected by the presence of the photodetector. Thus, it appears that the semi-insulating layer and the $SiO_2$ layer provide good insulation between the laser and the photodetector.

FIG. 3 illustrates the measured CW photodetector current as a function of the current in the laser section (dotted line); and, for comparison, the light output of the laser (solid line). The photodetector current increases rapidly up to threshold and then increases slowly. The rapid increase below threshold is caused by absorbed spontaneous emission generated in the active region of the laser. Above threshold, the increase in photodetector current is principally due to scattered stimulated emission. In the above threshold region, the responsivity of the photodetector can be expressed by the change in photodetector current per unit change in the stimulated light output from the facet. The measured responsivity is approximately 7–8 $\mu A/mw$.

From FIG. 3, it is clear that although the photodetector output increases with laser power output, the light vs. current characteristics of the laser is different from that of the photodetector characteristics. This is principally due to the large spontaneous emission below threshold that is absorbed by the photodetector. This effect is minimal for many lightwave system applications where the laser is biased CW near threshold and the light is modulated between an on-state and an off-state using modulation current. The laser and photodetector characteristics under the above noted conditions can be simulated using CW bias and pulsed injection current.

FIG. 4 illustrates ac coupled photodetector current as a function of pulsed injection. The laser is biased CW near threshold. The ac coupling eliminates the large below-threshold spontaneous emission induced photodetector current shown in FIG. 3. Also illustrated in FIG. 4 is the light output per facet as a function of pulsed modulation current. FIG. 4 shows that photodetector current follows linearly the stimulated light output from the laser facet. Thus, detector current can be used to monitor the output of a laser.

In the new improved integrated side-by-side laser-photodetector disclosed, the laser and photodetector sections can be isolated from each other by Fe or Ti doped semi-insulating layers of InP. The performance of the laser is comparable to other types of strongly index-guided lasers which do not have a photodetector; and, the photodetector current tracks the laser output power. In operation, a portion of the electromagnetic energy carried in the evanescent tail of the optical mode is detected by the photodetector for monitoring the average output power of the laser. The side-by-side relationship of the laser-photodetector results in a device which, for the first time, can track the laser output power without degrading the laser output power. In this invention, the current from the photodetector can be used to monitor the laser output to provide, with a feedback circuit, stabilization or control of the laser without degrading the output of the laser.

We claim:

1. A semiconductor apparatus comprising a laser-oscillator area and a light-detecting area comprising a substrate, a buffer layer disposed on said substrate, an undoped active layer disposed on said buffer layer, a doped cladding layer disposed on said undoped active layer, a doped contact layer disposed on said doped cladding layer, said laser-oscillator area comprising a first channel and said light detecting area comprising a second channel, said first and second channels being side-by-side on said substrate and having a depth which extends through said contact layer, said cladding layer, said undoped active layer and into said buffer layer, a semi-insulating doped layer disposed in each channel, a dielectric layer disposed on said contact layer and on said semi-insulating doped layers in said channels, said undoped active layer being both the light emitting region for the laser and the absorbing region for the photodetector.

2. The apparatus of claim 1 wherein said semi-insulating layer disposed in each channel in InP doped with Fe.

3. The apparatus of claim 1 wherein said semi-insulating layer disposed in each channel is InP doped with Ti.

* * * * *